United States Patent
Goel et al.

(10) Patent No.: US 8,826,202 B1
(45) Date of Patent: Sep. 2, 2014

(54) REDUCING DESIGN VERIFICATION TIME WHILE MAXIMIZING SYSTEM FUNCTIONAL COVERAGE

(71) Applicant: Taiwan Semiconductor Manufacturing Company, Ltd., Hsinchu (TW)

(72) Inventors: Sandeep Kumar Goel, Dublin, CA (US); Ashok Mehta, Los Gatos, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/890,732

(22) Filed: May 9, 2013

(51) Int. Cl.
*G06F 17/50* (2006.01)
*G06F 9/455* (2006.01)
*G06F 11/22* (2006.01)

(52) U.S. Cl.
USPC .......................................... 716/106; 716/136

(58) Field of Classification Search
USPC ................................................. 716/106, 136
See application file for complete search history.

(56) References Cited

U.S. PATENT DOCUMENTS

| 6,718,521 | B1* | 4/2004 | Bentlage et al. .............. 716/136 |
| 2009/0037858 | A1* | 2/2009 | Thakur et al. ..................... 716/5 |
| 2009/0037859 | A1* | 2/2009 | Thakur et al. ..................... 716/5 |
| 2014/0012560 | A1* | 1/2014 | Tzoref-Brill .................... 703/22 |

* cited by examiner

*Primary Examiner* — Suresh Memula
(74) *Attorney, Agent, or Firm* — Lowe Hauptman & Ham, LLP (57) ABSTRACT

A system for functional verification of a chip design includes the chip design, a test generator, a test bench, a verification tool, and a coverage tool. The coverage tool is configured to receive chip design, user input, and coverage files from the verification tool to generate information for the test generator to improve the test coverage of the verification tool. The method includes receiving a chip design, functionally testing the chip design, generating coverage files, receiving user options, including a coverage basis, a report basis, and a defined coverage, calculating coverage impact and new overall coverage using the defined coverage and coverage files, and ranking each report basis according to coverage impact of each coverage basis.

20 Claims, 4 Drawing Sheets

REDUCING DESIGN VERIFICATION TIME WHILE MAXIMIZING SYSTEM FUNCTIONAL COVERAGE

BACKGROUND

As semiconductor chip performance increases, the chip design becomes increasingly complex. Functionality from multiple chips is often integrated on a single chip as the ability to make more and smaller transistors improves. For example, the number of engines, such as central processing units (CPUs) and graphics processing units (GPUs), increases exponentially in successive technology generations. According to International Technology Roadmap for Semiconductors, in 2013 over two hundred engines are expected in one chip, increasing to over one thousand by 2020 and to over three thousand by 2024. The design of each of these engines and their relationships is verified by a design verification test prior to taping out the physical layout of the chip as a part of a path to launching a new product. An accurate and complete design verification test reduces the likelihood of product failure and can aid prototype test and debugging after manufacturing. As the number of engines, their complexity, and corresponding relationships become increasingly complex, the design verification test also becomes more time-consuming, labor-intensive, and resource-hungry.

DETAILED DESCRIPTION

With reference to the figures where like elements have been given like numerical designations to facilitate an understanding of the present subject matter, various embodiments of a system and method for design verification of complex semiconductor chips will be described.

Figure 1:
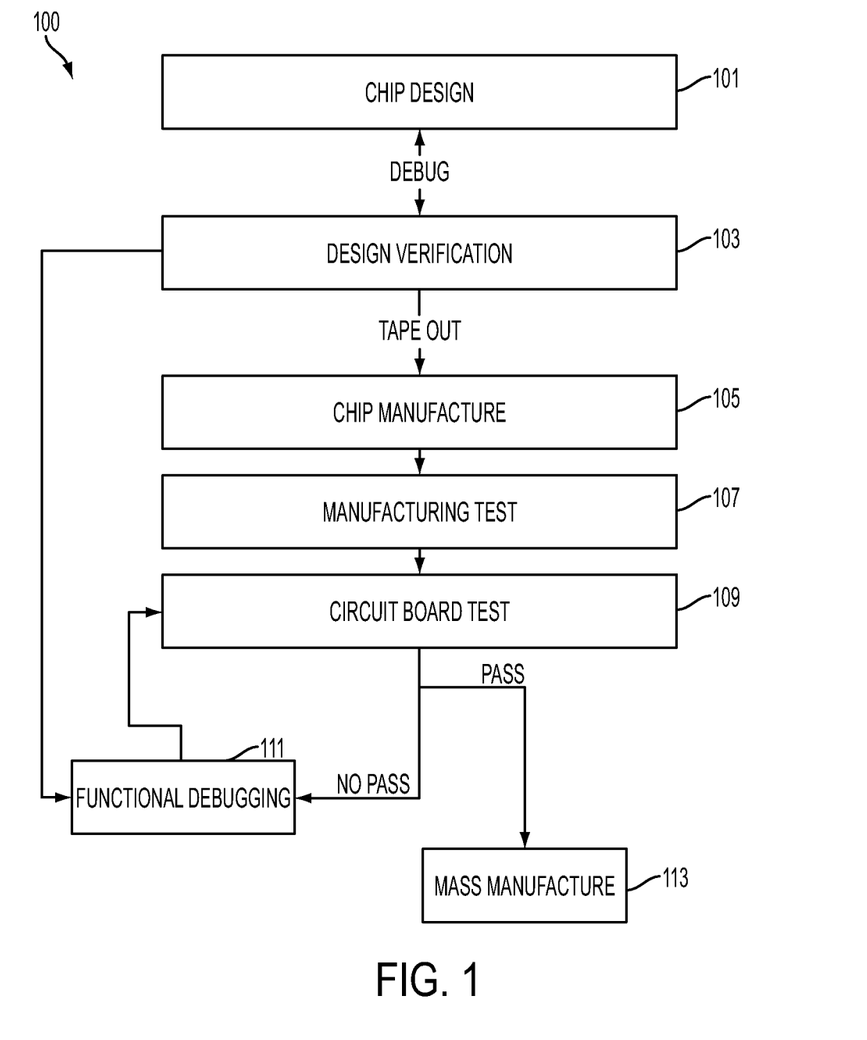
FIG. 1 is a simplified flow diagram of a chip design and manufacture process.

FIG. 1 is a top level flow diagram of a chip design and manufacture process 100. In operation 101, a chip is designed. A chip design includes functional descriptions of various modules of the chip, which may number in the thousands, tens of thousands, or more. Each module is designed to perform a specific type of function. One or more modules may be considered an engine, a core, or a processing unit. In one example, a commercially available system-on-chip (SoC) includes 4 central processing units (CPUs), 72 graphic processing units (GPUs), memory, accelerator, power modules, input/output modules and many other modules. Some or all of the modules are designed by one or more chip designers. Some modules include third-party intellectual property (IP) and some modules may be provided by a semiconductor manufacturer. The functional description is written in a hardware description language (HDL) that describes the structure, design and operation of electronic circuits. Commonly used HDLs include but not limited to Verilog, SystemVerilog, and VHDL and System C. Once the chip is designed, the design is verified in operation 103.

Design verification 103 includes functional verification and other aspects such as timing, layout, and power. Functional verification verifies that the chip would work as intended. In commonly used simulation based verification, stimulus is provided to exercise each line in the HDL code. A test-bench is built to functionally verify the design by providing scenarios to check that, given certain input, the design performs to specification. Due to the complexity of the designs, the standard test-benches do not check all portions of the code and must be modified to improve test coverage. A coverage report for each engine is generated as part of the test result in a first pass. The coverage report lists for each module and internal structure, such as statement or logic branch coverage of the verification test. For example, one test may have only evaluated x % (e.g., 20%) of the statements in code while the same test may have evaluated y % (y being equal or different than x) of the branches in the code. An analyst would then review the reports, determine what additional tests are needed, create one or more tests to improve the coverage. The newly created test is added to the test bench, the test is re-run, and a new coverage report is created in an iterative process to achieve a specified test coverage for a chip. Depending on the chip, passing a test having a total coverage of 100%, 95%, or less may be required for the design to tape out and proceed to manufacturing. Commercially available verification testers can generate thousands or tens of thousands of coverage reports for one chip, and even reviewing the individual files would take days and a lot of manpower. Running the verification test can take many hours or even days for complex designs. Many cycles of the iterative process may be required to achieve a specified coverage. Once the chip design passes the design verification, the design is "taped out" by sending the physical layout for manufacturing in operation 105. If chip design problems are found, the design is debugged by returning to the chip design in operation 101 in an iterative process until a chip design passes the design verification 103.

During chip manufacture, the physical layout is transferred to patterns on photomasks that are used in successive processes of adding and removing material to build a chip having many layers, e.g., hundreds of layers or more. Prototype wafers are subject to a variety of manufacturing tests in operation 107 during various stages of production. Each manufacturing test looks for specific defects associated with the manufacturing process. As a part of a manufacturing test or as a separate test, a "good chip" is identified and tested on a circuit board or via probes in operation 109 to verify that it works as intended. The chip functionality test emulates operating conditions as well as extreme (or corner) cases. If the good chip does not pass the chip functionality test, it is functionally debugged in operation 111 by comparing its output against an expected output from the functional verification. In other words, a same or equivalent test is given to the HDL code and to the good chip and the results should be the same. If they are not, then a problem may be isolated by testing increasingly finer portions of the HDL code versus the chip to isolate the cause. Only when the good chip passes the chip functionality test would the product go to mass manufacture in operation 113.

Embodiments of the present disclosure overcome the challenges associated with functional verification methods and avoid much of the iterative processes that are time consuming, labor-intensive, complex, and resource-hungry. In one aspect, the present disclosure pertains to a system for functional verification that includes a coverage tool to achieve a target functional test coverage without an iterative process through the verification tool. The coverage tool takes as input a first set of coverage files, the chip design, and user options to generate a set of elements whose coverage, if increased to the amount of a defined coverage, would result in an overall test coverage equal to or minimally greater than a target overall coverage. Thus, a minimum number of two functional test runs can be used to generate a set of verification tests for the test bench. The coverage tool minimizes overall simulation and/or verification time, debugging time, and overall development time thereby providing for a shorter time to market with the attendant economic advantages.

Figure 2:
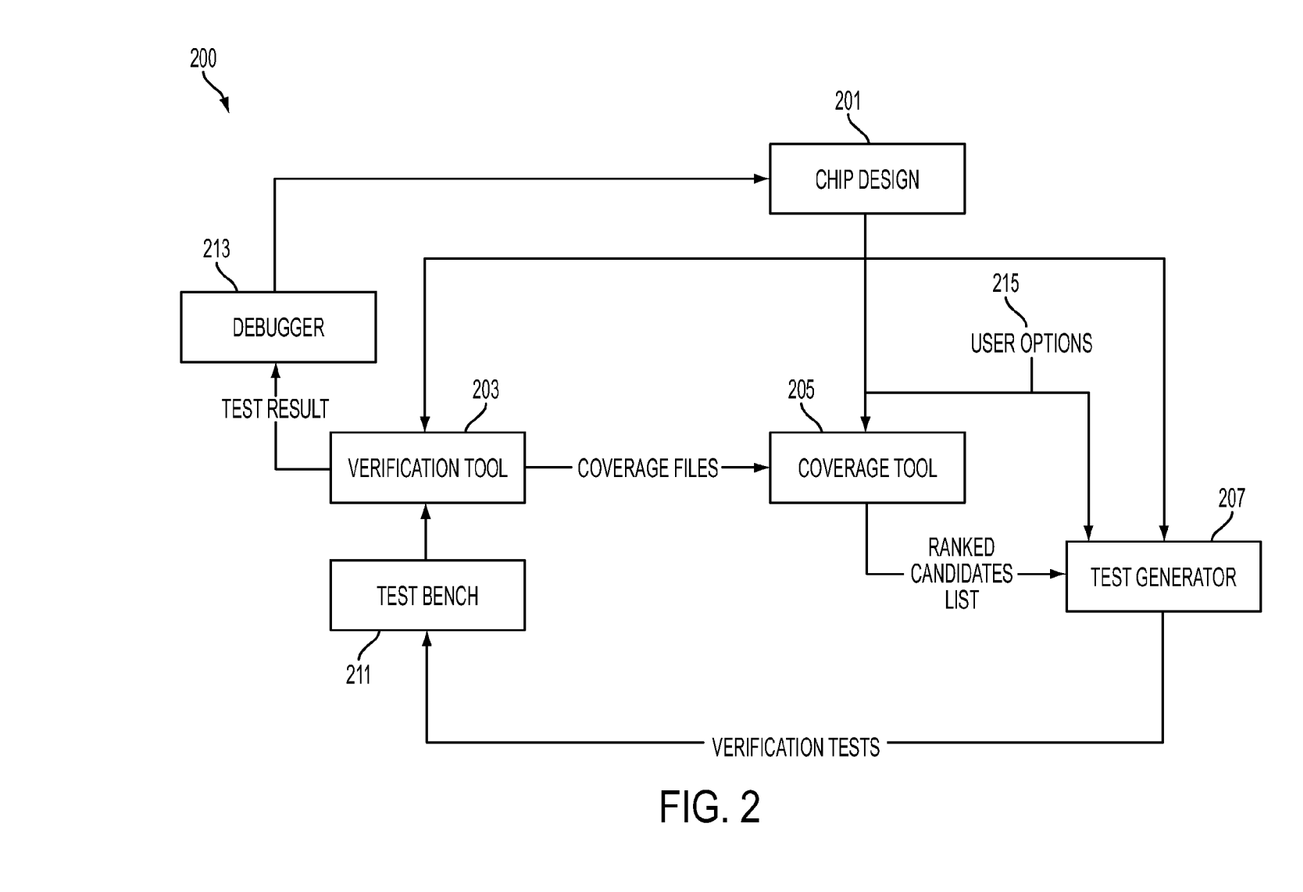
FIG. 2 is a simplified schematic diagram of a functional verification system in accordance with various embodiments of the present disclosure.

In accordance with various embodiments of the present disclosure, functional verification system 200 of FIG. 2 includes a chip design 201, a verification tool 203, a test generator 207, a test bench 211, and a debugger 213. The chip design 201 may be in forms of various HDL codes on a memory device, such as a hard-drive, optical disk, or another non-transitory computer readable medium. In a first pass to functionally verify the chip design 201, the chip design 201 along with user options 215 are given as input to the test generator 207. User options 215 include various user preferences for a first set of verification tests. For example, the user options 215 may include a list of modules, instances, design blocks, or other elements in the chip design 201 that the test generator 207 is to exclude from testing. Excluding certain elements can focus the functional testing or bypass third-party IP and library functions from being tested. For example, the chip design includes memory modules that are commercially available, elements within the memory module need not be tested. User options may also include a list of types of elements to be included in or to be excluded from verification tests. For example, a functional verification may not require testing of states in a finite state machine or transitions in the HDL code.

Using the chip design 201 and user options 215, the test generator 207 generates the first set of verification tests that becomes a part of the test bench 211. The test generator 207 may be an automated tool, for example, a verification application from Jasper Design Automation of Mountain View, Calif. The test generator 207 may also be one or more system analysts who manually write the test code. A mixture of automated tool and system analyst programming may be used to generate the verification tests for the test bench 211.

The test bench 211 is used by the verification tool 203 to functionally verify the chip design 201. Two of the main results from the verification tool 203 include a test result that is sent to the debugger 213 and coverage files that are sent to or received by the coverage tool 205. A number of verification tools are commercially available, including tools from Aldec, Inc. of Henderson, Nev., Cadence Design Systems, Inc. of San Jose, Calif., Mentor Graphics of Wilsonville, Oreg., and Synopsys, Inc. of Mountain View, Calif. In a first run of the verification tool 203, the test included in the test bench 211 may or may not achieve the target test coverage.

The coverage files are used by the coverage tool 205 along with chip design 201 and user options 215 to generate a ranked candidate list. The user options 215 may include some of the same information provided to the test generator 207 and additional information. In some embodiments, the user options used by the coverage tool 205 include a coverage basis, a report basis, defined coverage for the report basis or the coverage basis, a ranking metric, and a target overall coverage. The coverage basis determines the granularity of the coverage analysis. The coverage basis may be instance, module, or hierarchy. In the instance basis, all instances in the chip design are considered to be independent. In a module basis, all instances of a given module are considered as a group and updated together. In a hierarchy basis, all instances at and under a given hierarchy level are considered as a group and updated together. For each coverage basis, different calculations are performed. These calculations include a new overall coverage and coverage impact that may be calculated in different ways depending on user input. The new overall coverage is the coverage for the entire chip design if coverage of the coverage basis is raised to the user-defined coverage. The coverage impact calculates a ratio of a change in the overall coverage relative to a change in the coverage of the coverage basis to the defined coverage. The coverage impact may also include other factors such as a size of the coverage basis and a weight factor. A higher coverage impact means that the test generator should preferentially test that coverage basis to increase the overall coverage. These calculations are discussed in more detail in association with FIGS. 3 and 4.

The coverage tool 205 generates a ranked candidate list and other charts and reports. The ranked candidate list includes each of the report basis according to its coverage impact. The report basis may be the same or different from the coverage basis; however, the report basis should be at the same level or a higher level than the coverage basis. For example, the coverage basis may be at the instance level, so that the analysis is performed at every instance, but the report basis may be at the modular level, so that all of the instances under one module is reported and ranked together. The ranked candidate list shows where improvements in coverage would have the most beneficial impact to the overall coverage.

The user may specify a number of candidates to generate tests because test generation, if done manually, can be labor intensive. The ranked candidate list may show the overall coverage if any number of candidate report basis is improved by including a cumulative overall coverage. For example, the first candidate is the report basis that has a maximum coverage impact. The overall coverage attainable by improving the coverage of the first candidate to the defined coverage is calculated and listed. The second candidate is the report basis that has the second highest coverage impact. The overall coverage attainable by improving the second candidate alone and a cumulative coverage attainable by improving both the first and second candidates may be calculated and listed. By reviewing the ranked candidate list, a system analyst can quickly pinpoint a set of report basis that should be tested to achieve a target overall coverage.

The test generator 207 generates a second set of verification tests using the information in the ranked candidate list, the chip design 201, and user options 215. The second set of verification tests is included in the test bench 211 and used by the verification tool 203 to functionally test the chip design 201. If the test result indicates that the chip design 201 does not function as intended, a debugger 213 is used to find the cause of malfunction and appropriate design changes are made to-chip design 201.

The system 200 with the coverage tool 205 dramatically reduces total verification time for complex chip design involving additional testing. For one specific chip design, the reduction in verification time may be decreased many fold as the number of added tests increase. The verification time saving includes reducing the number of tests added and time to compile and run iterative verification tests to achieve a target overall coverage. Without a coverage tool, a system analyst chooses elements to test based on review of the coverage files and his preferences without knowing the coverage impact of the elements chosen. Often, the system analyst improves coverage for the easy-to-access modules first. The written tests may not sufficiently increase the total overall coverage and he would have to write additional tests. Time to create and write the verification tests can consume more than 90% of the total verification time if more than 32 tests are added. By focusing the test creation and writing to the modules with most coverage impact, the overall number of verification tests is reduced.

Figure 3:
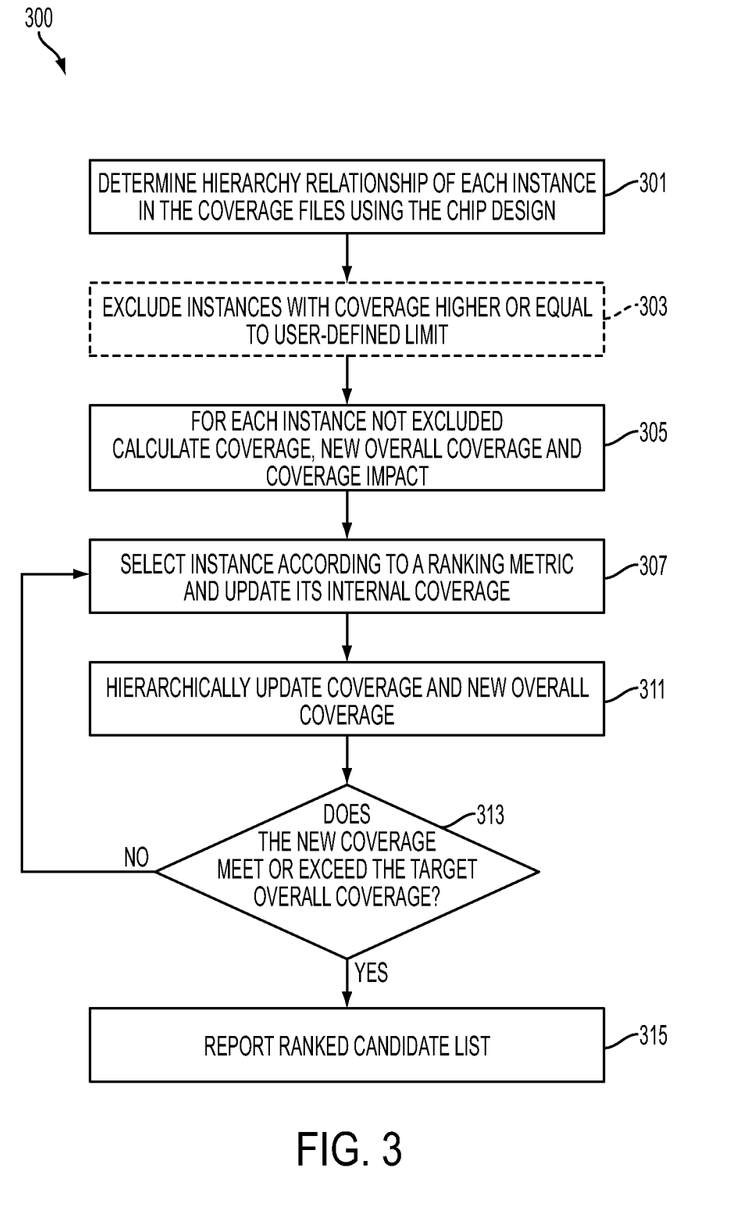
FIG. 3 is a flow diagram of a methods performed in a coverage tool according to various embodiments.

FIG. 3 is a flow diagram of a method 300 performed in a coverage tool according to various embodiments. The coverage tool receives or retrieves various inputs, including the chip design, coverage files from a verification tool, and user options. The user options include a list of elements to be excluded from the analysis and/or parameters to exclude elements from the analysis. In operation 301, the hierarchy relationship of each instance in the coverage files is determined using the chip design. Depending on the verification tool used, the coverage files may organize the instances in a number of ways. By referring to the chip design and correlating the instances from the coverage files to the structure in the chip design, relationship of the coverage data can be constructed.

Figure 4:
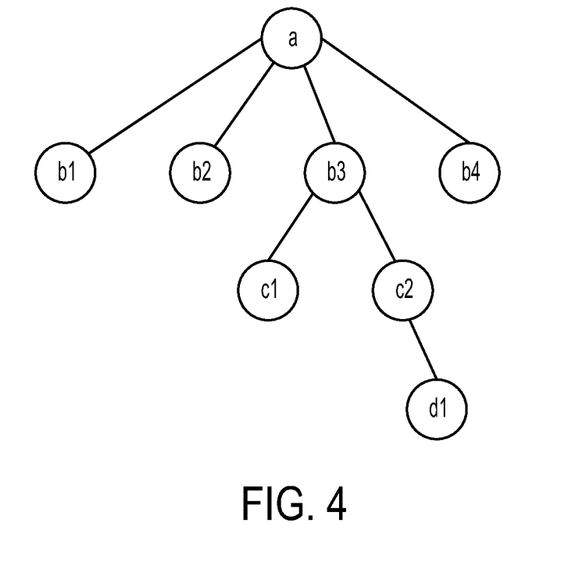
FIG. 4 is a simplified conceptual diagram of an example hierarchy of a chip design.

FIG. 4 is an example hierarchy structure for an element a. Element a may be a module, a block, or an instance, and contains lines of code and other items to be tested. Example of the other items includes a state transition, a finite state, a statement, or an expression. In the example hierarchy structure of FIG. 4, element a has a first sub-level b with 4 elements b1, b2, b3, and b4. A second sub-level c is under the first sub-level b, shown with two elements c1 and c2. A third sub-level d is under the second sub-level c, shown with one element d1. The coverages of elements in a parent-child relationship are related. As shown in FIG. 4, the coverage of element a depends on coverage of b3 which depends on coverage of c2, etc. The items within each element are examined to determine an internal coverage. An item may be a line of code or other types of item that may be tested. If all of the items (for example, 150 items) internal to c2 are examined in the verification tests, its internal coverage is 150/150, which is 100%. However, if the d1 internal coverage (which is also the coverage of d1 because d1 does not have an immediate child) is 0/50(0%), the c2 coverage is 50%, which is the average of the c2 internal coverage (100%)–and the d1 coverage (0%). As used herein, coverage of a parent is the average of its internal coverage and coverage of all immediate children. Thus, the coverage for b3 is the average of its internal coverage and the coverage of c1 and c2. When the coverage basis is selected at a high level, then the internal coverage includes items in any children in the hierarchy. For example, if the coverage basis is at a module level, then all instances under the module are considered to be internal to the module.

Referring back to FIG. 3, in optional operation 303, instances with coverage higher than or equal to a user-defined limit are tagged and excluded from further analyses in operations 305 to 311. These instances having higher coverages would have negative coverage impacts if their coverages were to be changed to the user-defined limit. This operation decreases the total amount of computations in the coverage tool; however, including this operation does not affect the result in some embodiments.

In operation 305, for each instance not excluded from testing, its coverage, new overall coverage and coverage impact are calculated. As discussed, the coverage of an instance is the average of its internal coverage and coverage of its immediate children. The new overall coverage is the overall coverage for the highest level of the chip design if the instance coverage is increased to the user-defined limit. For example, if a particular instance has a coverage of 0, the old overall coverage is 70%, and the user-defined limit is 80%, the new overall coverage is calculated by assuming the particular instance has a new coverage of 80%. The new overall coverage calculation is discussed using FIG. 4 and Table 1 below. The new overall coverage is calculated by successively updating coverage for each parent until a new coverage at the topmost level is calculated. The new coverage at the topmost level for a given change in coverage for one instance is the new overall coverage for that instance. The new overall coverages (i.e., the coverage for 'a' if the instance coverage is changed to the user-defined limit) for each instance is calculated and listed in the "New Overall Coverage" column. The interim calculations are discussed and not shown in Table 1. In the example hierarchy of FIG. 4, the new overall coverage for d1 is calculated by calculating the coverage for element a with an increase in the coverage for d1 to 0.8 (i.e., user-defined limit of 80%) When the d1 coverage is 0.8, the coverage for c2 would be 0.6, which is the average of the c2 internal coverage (i.e., 0.4) and the d1 new coverage (i.e., 0.8). The new coverage for c2 increases the coverage for b3 to 0.27, which is the average of the b3 internal coverage (i.e., 0), the c1 coverage (i.e., 0.2), and the new c2 coverage (i.e., 0.6). The new coverage for b3 increases the coverage for element a to 0.37, which is the average of the element a internal coverage (i.e., 0.1), the b1 coverage (i.e., 0.3), the b2 coverage (i.e., 0.5), and the b4 coverage (i.e., 0.7), and the new coverage (i.e., 0.27) for b3. The new coverage of 0.37 for element a is the new overall coverage for d1 as a result of increasing the coverage of d1 up to the user-defined limit of 80%. Summarized as a formula where C means Coverage, the New Overall Coverage for d1 is Average of ($C_{a,\ internal}$, $C_{b1}$, $C_{b2}$, average of ($C_1$, average of ($C_{2,\ internal}$, user-defined limit), $C_{b4}$)

Having described how the New Overall Coverage is calculated for d1, which is the most complex case for the hierarchy of FIG. 4, the other elements are calculated in a similar fashion. In a simpler example, the New Overall Coverage for b1 is 0.46, which is the average of internal coverage for element a (0.1), user-defined limit for b1 (0.8), b2 coverage (0.5), b3 coverage (0.22), and b4 coverage (0.7).

TABLE 1

|     | Items | Internal Coverage | Coverage | New Overall Coverage | Coverage Impact 1 | Coverage Impact 2 | Coverage Impact 3 |
| --- | --- | --- | --- | --- | --- | --- | --- |
| a   | 100  | 0.1 | 0.36 | 0.46 | 0.22  | 13.04 | 0.22 |
| b1  | 200  | 0.3 | 0.3  | 0.46 | 0.20  | 7.57  | 0.01 |
| b2  | 3000 | 0.5 | 0.5  | 0.42 | 0.20  | 0.71  | 0.11 |
| b3  | 300  | 0   | 0.22 | 0.48 | 0.20  | 3.53  | 0.04 |
| b4  | 400  | 0.7 | 0.7  | 0.38 | 0.20  | 8.83  | 0.02 |
| c1  | 500  | 0.2 | 0.2  | 0.40 | 0.07  | 0.88  | 0.01 |
| c2  | 600  | 0.4 | 0.45 | 0.39 | 0.07  | 0.98  | 0.01 |
| d1  | 200  | 0.5 | 0.5  | 0.37 | 0.033 | 1.77  | 0.00 |
| total | 5300 |     |      |      |       |       |      |

Having calculated the new overall coverage for d1, the coverage impact is calculated. The coverage impact is a way to rate the relative effectiveness to change the overall coverage by changing the one instance to the user-defined limit. The coverage impact may be defined in a number of ways and may even be a mathematical relationship that the user can define. In one example, the coverage impact is the change in overall coverage over the change in the instance coverage. In the example of d1, the coverage impact is calculated as (new overall coverage of d1 (0.37)–coverage of element a (0.36))/ (user defined limit (0.8)–coverage of d1(0.5)), or 0.01/0.3 equaling 0.033. The coverage impact of each of the instances is shown in the Coverage Impact 1 column in Table 1. The coverage impact may be defined to be proportional to the instance size. Such definition would take into account the relative size of the instance in the overall coverage. In one example, the coverage impact is inversely proportional to the instance size (Coverage Impact 2 in Table 1) or directly proportional to the instance size (Coverage Impact 3 in Table 1). The Coverage Impact 2 is a product of the Coverage Impact 1 and a ratio of the total number of instances and the number of remaining (not covered) internal items. For example, the Coverage Impact 2 of d1 (1.77)—is its Coverage Impact 1 (0.033)*(total number of items (5300)/(number of items in d1 (200)*(1−internal coverage of d1 (0.5)))). The instance size for Coverage Impact 3 includes the size of all instances, internal and children. For example, the Coverage Impact 3 of b3 (0.04) is its Coverage Impact 1 (0.20)*((Sum of number of items in b3, c2, and d1 (1100)/total number of items (5300)). The coverages, new overall coverage, and coverage impacts for various elements in FIG. 4 for a user-defined limit of 80% are listed in Table 1 for corresponding hypothetical instance sizes (i.e., numbers of items in corresponding instances) and internal coverages. The process is repeated for each instance in the chip design to calculate new overall coverages and coverage impacts.

While Table 1 and the discussion above use a specific formula to calculate coverages, other formulas are possible. For example, one may use a weighted average instead of a simple average to calculate the coverage. The weight may be assigned based on the size or type of items in the instance. In one example, the internal coverage may be given more weight. Further the coverage impacts may be calculated using a different formula that takes into account a variable other than the size of the instance. For example, the type of instance or the type of items in the instance may influence the coverage impact. In another example, the size of instance for the Coverage Impact 2 and Coverage Impact 3 may not include the size of children instances or only include the size of immediate children. In yet another example, the size of instance for the Coverage Impact 2 and the Coverage Impact 3 includes only the number of items not tested in that instance.

Referring back to FIG. 3, after the coverage impacts are calculated, one instance is selected in operation 307 according to a ranking metric and its internal coverage is updated. The ranking metric is defined by the user as a part of the user input. In some embodiments, the ranking metric is the Coverage Impact 1 and secondarily the new overall coverage. According to Table 1, the instances with the highest Coverage Impact 1 is element a. Element a is selected and its internal coverage is updated to 0.8, i.e., the user-defined limit. Changing the internal coverage for element a affects the coverage for element a and new overall coverages for all other elements. In operation 311, the coverage and new overall coverages are hierarchically updated for all instances. In operation 313, whether the newly calculated coverage of element a exceeds or meets the target overall coverage is determined. Assuming a target overall coverage of 0.7, the newly calculated coverage for element a after updating its internal coverage is 0.503, which is still less than the target overall coverage. If the answer is yes, then changing the internal coverage of element a is enough and no other instance needs to be tested to meet the target overall coverage and the process proceeds to reporting the ranked candidate list in operation 315. If the answer is no, then the process returns to operation 307 where another instance is selected.

Returning to operation 307, the elements with the next highest Coverage Impact 1 are elements b1, b2, b3, and b4. Among the instances with the next highest Coverage Impact 1, the one with the highest new overall coverage is selected. If two or more instances have the same new overall coverages, then a different user-defined parameter such as size of instance, original coverage, etc. can be used to select the next instance. In Table 1, b3 has the highest new overall coverage. The internal coverage for b3 is then updated to 0.8, i.e., the user-defined limit. As a result of changing the internal coverage for b3, the b3 coverage is changed, which causes the coverage of element a to also change. The new overall coverages for b1, b2, b4, c1, and c2 also change because of the change in the internal coverage of b3. In operation 313, whether the newly calculated coverage of element a exceeds or meets the target overall coverage is determined. The coverage for element a after updating b3 is 0.557, which is still less than the target overall coverage of 0.7. In the example of Table 1, after updating the internal coverage of b3, the b1 new overall coverage becomes the highest among b1, b2, b3, and b4, so b1 is selected next and its internal coverage updated to 0.8. The coverage for element a after updated b1 is 0.657, which is still less than the target overall coverage. By now only two elements, b2 and b4 remain from the coverage basis with the highest Coverage Impact 1, and b2 is selected because it has a higher new overall coverage. Updating b2 results in coverage of element a to become 0.717, exceeding the target overall coverage. The process then proceeds to operation 315 where a ranked candidate list is reported, showing that by increasing the internal coverages of elements a, b3, b1, and b2 to the user-defined limit of 0.8, the target overall coverage of 70% is achieved. The ranked candidate list report may include a cumulative overall coverage that shows the progression of coverage for the topmost element in the hierarchy, element a in an example, as each instance is updated. In other words, in the listing of the elements to update (a, b3, b1, and b2) as the example, the listing would also include the cumulated effect to the coverage of element a for each change (0.503, 0.557, 0.657, and 0.717).

According to various embodiments, the target overall coverage and the user-defined limit for the internal coverage may be defined separately or together. In some embodiments, the user-defined limit and the target overall coverage are the same. In the example of Table 1, different values are used. The target overall coverage cannot be higher than the user-defined limit.

In some embodiments, a different ranking metric is used. For example, a ranking metric that takes into account the number of untested items in an instance may be used. Coverage Impact 2 of Table 1 is calculated as a product of a ratio of the change in overall coverage to the change in the instance coverage with a ratio of the number of all items to the number of untested items. According to Coverage Impact 2, the instance ranking result is slightly different than that using Coverage Impact 1 and a different set of elements are selected for the ranked candidate list report. The operations of 307, 311, 313 results in elements a, b4, b1, b3, d1, and c2 being selected as ranked candidates to achieve the target overall coverage of 70%. Note that by taking into account of size of instance, element b2 having a largest number of items, at 3000 items, was avoided in lieu of b4, d1, and c2, resulting in fewer total items for whom verification tests are written, although these fewer total items are dispersed in more instances.

Ranking metrics may include additional variables that take into consideration the ease of testing for different types of modules or types of untested items. In some embodiments, different types of modules are weighted differently in the coverage impact calculations based on its ease of testing. For example, creating a verification test for a memory module is easier than creating one for a signal processing module. Certain modules that are deemed easier to test may be weighed more heavily than others. Other modules that may be weighed more heavily include those that deemed to be more important or more likely to fail. For example, a newly designed module making use of previously not available technology may be marked to be heavily tested. The user input may include options for these weights.

Referring back to Table 1, yet another example ranking metric is used in Coverage Impact 3. Coverage Impact 3 of Table 1 is calculated as a product of a ratio of the change in overall coverage to the change in the instance coverage with a ratio of the number instance internal items to the number of total items. Ranking the instances according to Coverage Impact 3 involves a preference for instances with more internal items and may results in fewer total number of instances to test. The ranking metric may be calculated many ways according to user input. Scores for ranking may include a user-defined importance, user defined ease of testing, and other weights as defined by the user.

The ranked candidate list reported in operation 315 is organized according to a report basis from the user. The report basis may be instances, modules, hierarchy, or other selectable report basis. The report basis may be the same as the coverage basis or different. For a report basis of modules, for example, the modules having a ranked coverage basis are listed. The test generator can then generate tests in the modules in the ranked candidate report. In some embodiments, the report basis does not change the analysis performed by the coverage tool, only the format of the ranked candidate list report is changed. In other embodiments, the report basis is used instead of a coverage basis in the ranking process to produce a ranked report basis candidate list.

Referring back to the system 200 of FIG. 2, in some embodiments, the coverage tool 205 generates a report for an automated test generator 207 that may be used to automatically generate one or more verification tests by the test generator 207. Automated test generators 207 may have input requirements different from a system analyst who manually writes the test code. For example, a detailed report including references to items in the test code may be generated for the automated test generator 207. After the new verification tests are added to the test bench 211, the chip design 201 is functionally verified using a verification tool 203 in a second functional test. The coverage files are analyzed to verify that the target overall coverage is achieved. The test results are sent to a debugger 213 where any test failures are debugged and the chip design is fixed accordingly. If the chip design is changed, then the functional verification test process may be repeated by changing verification tests for the changed portion of the chip design. Further, a second coverage file may indicate that the target overall coverage is not achieved. In some cases, the new verification test may not reach all intended items as defined by the user-defined limit. The new verification test may also test more items than specified by the user-defined limit. One or more iterations may still be used to reach the target overall coverage. However, the total number of iterations through the verification tool is reduced from a system without the coverage tool.

Various embodiments described herein may be implemented in the form of one or more programs recorded in a non-transitory, computer-readable medium. Here, this medium may contain, alone or in combination, program instructions, data files, data structures, and the like. For example, the medium includes hardware devices specially configured to store and execute program instructions, including magnetic media such as a hard disk, a floppy disk and a magnetic tape, optical media such as CD-ROM (Compact Disk Read Only Memory) and DVD (Digital Video Disk), magneto-optical media such as optical disk, ROM, RAM (Random Access Memory), and flash memory. In some embodiments, one or more of the processes or functionality described herein is/are performed by specifically configured hardware (e.g., by one or more application specific integrated circuits or ASIC(s)). Some embodiments incorporate more than one of the described processes in a single ASIC. In some embodiments, one or more of the processes or functionality described herein is/are performed by at least one processor which is programmed for performing such processes or functionality.

One aspect of the present disclosure pertains to a method for verifying a functionality of a chip design. The method includes receiving a chip design having design blocks, functionally testing the design blocks on a test bench using a verification tool, receiving coverage files from the verification tool, receiving a design exclusion list and user options, for each element or design block not excluded, calculating coverage impact and new overall coverage using a defined coverage and the coverage files, ranking each element or design block according a ranking metric, reporting a candidate list according to coverage impact and new overall coverage of each element or design block, and outputting a ranked candidate list.

In another aspect, the present disclosure pertains to a computer readable storage medium having instructions stored thereon, the instructions when executed by a processor causing the processor to perform a number of operations. The operations include receiving or retrieving from a first memory a chip design in hardware description language (HDL), receiving or retrieving from a second memory coverage files generated by a verification tool, receiving user options, said user options including a coverage basis, a defined coverage, and a coverage impact metric, for each instance in the HDL, calculating a coverage impact and a new overall coverage using the coverage files and the user options, ranking each coverage basis according to coverage impact of each instance in the coverage basis, calculating a cumulative overall coverage for each coverage basis using the defined coverage for the coverage basis and any higher-ranked coverage basis, selecting a plurality of coverage basis that has a cumulative overall coverage equal to or minimally greater than a user-defined target overall coverage, and outputting a ranked coverage basis candidate list.

In yet another aspect, the present disclosure pertains to a system for verifying a functionality of a chip design in HDL. The system includes a memory device for storing a chip design in an HDL, a test generator configured to generate a set of verification tests using the chip design and optionally a ranked element candidate list, a test bench containing the set of verification tests, a verification tool and configured to analyze the HDL using the test bench and output a test result and coverage files, and a coverage tool configured to analyze the coverage files, receive user options, and output the ranked element candidate list. As disclosed, the element may be specified by the user to be at a basis level appropriate for the test generator. The element may be instances, modules, or different levels of hierarchy.

While preferred embodiments of the present subject matter have been described, it is to be understood that the embodiments described are illustrative only and that the scope of the invention is to be defined solely by the appended claims when accorded a full range of equivalence, many variations and modifications occurring to those of ordinary skill in the art from a perusal hereof.

The invention claimed is:

1. A method for verifying a functionality of a chip design, the method performed by at least one processor and comprising:
 (a) receiving a chip design having a plurality of design blocks;
 (b) functionally testing the plurality of design blocks on a test bench using a verification tool;
 (c) receiving coverage files corresponding to the plurality of design blocks from the verification tool;
 (d) receiving a design exclusion list, a coverage basis and a defined coverage;
 (e) for the coverage basis and each of non-excluded design blocks in the plurality of design blocks but not in the design exclusion list, calculating coverage impact and new overall coverage using the defined coverage and the coverage files;
 (f) ranking each of the non-excluded design blocks according to the calculated coverage impact and new overall coverage; and
 (g) generating a ranked candidate list based on said ranking.

2. The method of claim 1, further comprising:
 after removing a ranked design block among the non-excluded design blocks, recalculating new overall coverage and re-ranking each remaining design block among the non-excluded design blocks.

3. The method of claim 1, wherein said ranking comprises:
 ranking each design block among the non-excluded design blocks from maximum coverage impact to minimum coverage impact; and
 calculating overall coverage for each design block among the non-excluded design blocks using the defined coverage.

4. The method of claim 3, wherein said ranking further comprises:
 calculating a cumulative overall coverage for each design block among the non-excluded design blocks using the defined coverage for the design block and any higher-ranked design block.

5. The method of claim 4, further comprising:
 selecting a report basis and organizing the ranked candidate list according to the report basis.

6. The method of claim 1, wherein said ranking comprises:
 scoring each design block among the non-excluded design blocks using the calculated coverage impact, user-defined importance, and user-defined ease of testing;
 ranking each design block among the non-excluded design blocks based on the scoring; and
 calculating a cumulative overall coverage for each design block among the non-excluded design blocks using the defined coverage for the design block and any higher scored design block.

7. The method of claim 1, further comprising
 selecting one or more design blocks among the non-excluded design blocks such that a cumulative overall coverage among the selected one or more design blocks is equal to or greater than a target overall coverage.

8. The method of claim 7, wherein the selecting is performed using a user defined preference.

9. The method of claim 1, further comprising:
 receiving one or more tests for improving coverage of one or more design blocks among the non-excluded design blocks; and
 adding the one or more tests to the test bench.

10. The method of claim 9, further comprising:
 functionally testing the plurality of design blocks on the test bench after said adding the one or more tests to the test bench.

11. The method of claim 1, wherein said calculating coverage impact comprises
 calculating a new overall coverage using the defined coverage; and
 calculating the coverage impact based on a ratio of a difference between the new overall coverage and previous overall coverage to a difference between the defined coverage and previous coverage for the coverage basis.

12. The method of claim 1, wherein said calculating coverage impact comprises:
 calculating a new overall coverage using the defined coverage; and
 calculating the coverage impact as being proportional to a size of the coverage basis and a ratio of a difference between the new overall coverage and previous overall coverage to a difference between the defined coverage and previous coverage for the coverage basis.

13. The method of claim 1, wherein the coverage basis is instance basis or module basis.

14. The method of claim 1, further comprising:
 receiving a user-defined hierarchy level, wherein the coverage basis is hierarchy basis.

15. A non-transitory, computer readable storage medium having instructions stored thereon, the instructions when executed by a processor causing the processor to perform the operations of:
 (a) receiving or retrieving a chip design in hardware description language (HDL) code;
 (c) receiving or retrieving coverage files generated by a verification tool configured to functionally test the chip design;
 (d) receiving user options, said user options including a coverage basis, and a defined coverage;
 (e) for each instance among a plurality of instances in the HDL code, calculating a coverage impact and a new overall coverage using the coverage files and the user options;
 (f) ranking each instance among the plurality of instances according to the calculated coverage impact for the coverage basis;
 (g) calculating a cumulative overall coverage for each coverage basis using the defined coverage for the coverage basis and any higher-ranked coverage basis;
 (h) selecting one or more instances among the plurality of instances and changing coverage of the selected one or more instances based on the defined coverage such that the cumulative overall coverage is equal to or greater than a target overall coverage; and
 (i) outputting a ranked candidate list based on the selecting.

16. The computer readable storage medium of claim 15, wherein the ranked candidate list is in a format readable by a test generator configured to generate one or more tests for improving coverage of the coverage basis.

17. A system for verifying a functionality of a chip design in hardware description language (HDL), the system comprising:
 a memory device for storing a chip design in an HDL code;
 a test generator configured to generate a set of verification tests using the chip design;
 a test bench containing the set of verification tests;
 a verification tool configured to analyze the HDL code using the test bench and output a test result and coverage files; and a coverage tool configured to analyze the coverage files, receive user options, and output a ranked candidate list, wherein the test generator is configured to receive the ranked candidate list and generate, based on the ranked candidate list, one or more tests to be added to the set of verification tests in the test bench.

18. The system of claim 17, further comprising:

an output device configured to store or display the ranked element candidate list.

19. The system of claim 17, wherein the user options comprise at least one selected from the group consisting of coverage basis, a report basis, a ranking metric, a defined coverage, and a target overall coverage.

20. The system of claim 19, wherein the coverage tool is configured to analyze the coverage files by selecting candidates according to coverage basis;

calculating coverage impact and new overall coverage for each candidate using the defined coverage and coverage files;

selecting a first candidate using the ranking metric;

re-calculating new overall coverage for each remaining candidates;

selecting a second candidate using the ranking metric;

re-calculating new overall coverage for each remaining candidates; and, repeating the selecting and re-calculating until a cumulated overall coverage is equal to or greater than the target overall coverage;

reporting the selected candidates according to report basis.

* * * * *